(12) United States Patent
Desai et al.

(10) Patent No.: US 9,520,165 B1
(45) Date of Patent: Dec. 13, 2016

(54) HIGH-SPEED PSEUDO-DUAL-PORT MEMORY WITH SEPARATE PRECHARGE CONTROLS

(71) Applicant: QUALCOMM Incorporated, San Diego, CA (US)

(72) Inventors: Nishith Nitin Desai, San Diego, CA (US); Tony Chung Yiu Kwok, San Diego, CA (US); Changho Jung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/745,216

(22) Filed: Jun. 19, 2015

(51) Int. Cl.
*G11C 7/12* (2006.01)
*G11C 11/4094* (2006.01)
*G11C 11/419* (2006.01)

(52) U.S. Cl.
CPC ............... *G11C 7/12* (2013.01); *G11C 11/419* (2013.01)

(58) Field of Classification Search
USPC ........................................................ 365/203
See application file for complete search history.

(56) References Cited

U.S. PATENT DOCUMENTS

| | | | |
|---|---|---|---|
| 6,829,189 B2 | 12/2004 | Lim et al. | |
| 7,733,724 B2 | 6/2010 | Hsu et al. | |
| 8,223,570 B2 | 7/2012 | Kushida | |
| 2003/0090950 A1 | 5/2003 | Lim et al. | |
| 2003/0156487 A1* | 8/2003 | Izutsu | G11C 29/025 365/230.03 |
| 2008/0080297 A1* | 4/2008 | Starnes | G11C 7/22 365/233.1 |
| 2008/0183984 A1 | 7/2008 | Beaucler et al. | |
| 2011/0149667 A1* | 6/2011 | Hamzaoglu | G11C 11/413 365/203 |
| 2014/0140144 A1 | 5/2014 | Nakazato | |
| 2014/0269110 A1 | 9/2014 | Yang et al. | |
| 2015/0109865 A1 | 4/2015 | Gulati et al. | |

OTHER PUBLICATIONS

International Search Report and Written Opinion—PCT/US2016/033123—ISA/EPO—Sep. 28, 2016.

\* cited by examiner

*Primary Examiner* — Hoai V Ho
*Assistant Examiner* — Minh Dinh
(74) *Attorney, Agent, or Firm* — Haynes and Boone, LLP

(57) ABSTRACT

A pseudo-dual-port (PDP) memory such as a PDP SRAM is provided that independently controls the bit line precharging and the sense amplifier precharging to increase memory operating speed while eliminating or reducing the discharge of crowbar current.

20 Claims, 4 Drawing Sheets ated in one or more of the figures.

HIGH-SPEED PSEUDO-DUAL-PORT MEMORY WITH SEPARATE PRECHARGE CONTROLS

TECHNICAL FIELD

This application relates to pseudo-dual-port (PDP) memories having independent bit line and sense amplifier precharging.

BACKGROUND

A dual-port static random access memory (SRAM) cell requires at least eight transistors. In contrast, a traditional single-port SRAM cell requires only six transistors. As compared to a single-port SRAM cell, a dual-port SRAM cell requires two extra access transistors to accommodate the additional port. Because single-port SRAM is thus substantially denser than dual-port SRAM, "pseudo-dual-port" (PDP) SRAMs have been developed in which the single port of traditional SRAM is time-multiplexed to represent two separate ports.

Although pseudo-dual-port SRAM has higher density, this improved density comes at the cost of slower operation in that a single clock cycle must accommodate two access cycles to simulate the two ports of actual dual-port SRAM. The resulting multiplexing of the access port places timing demands on the sense amplifier. It is desirable to increase the operating speed of PDP SRAMs so that they can be used as an alternative to traditional dual-port SRAMs to increase density.

Accordingly, there is a need in the art for PDP SRAMs with increased operating speed.

SUMMARY

A PDP SRAM is provided in which a pair of bit lines couple through a read multiplexer to a corresponding pair of input nodes for a voltage-mode sense amplifier. Depending upon whether a read multiplexer signal is asserted, the read multiplexer either couples the sense amplifier input nodes to the pair of bit lines or isolates the pair of input nodes from the pair of bit lines. The read multiplexer couples to the bit lines between a bit line precharge circuit and a sense amplifier precharge circuit. The bit line precharge circuit is configured to precharge the bit lines responsive to an assertion of a bit line precharge control signal. Similarly, the sense amplifier precharge circuit is configured to precharge the pair of input nodes responsive to an assertion of a sense amplifier precharge signal. A control signal generator triggers a bit line precharging for a write operation by asserting the bit line precharge control signal while the sense amplifier is still responding to the assertion of a sense enable signal for a read operation. The bit line precharging occurs while the sense amplifier is isolated from the bit lines by the read multiplexer. After completion of the sense enable signal assertion, the control signal generator asserts the sense amplifier precharge signal.

The resulting PDP SRAM advantageously may begin the write operation precharging of the bit lines while the sense amplifier is still finishing a read operation. In particular, the precharging of the bit lines occurs while the sense amplifier is still responding to the assertion of the sense enable signal. This increased speed does not come at the cost of increased power consumption because the sense amplifier precharging is bifurcated from the bit line precharging. In particular, the sense amplifier input nodes are not precharged until the sense enable signal is no longer asserted. In this fashion, the discharge of crowbar current during the sense amplifier precharging for the subsequent write operation is greatly reduced or eliminated.

These and additional advantageous features may be better appreciated with regard to the following detailed description of example embodiments.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
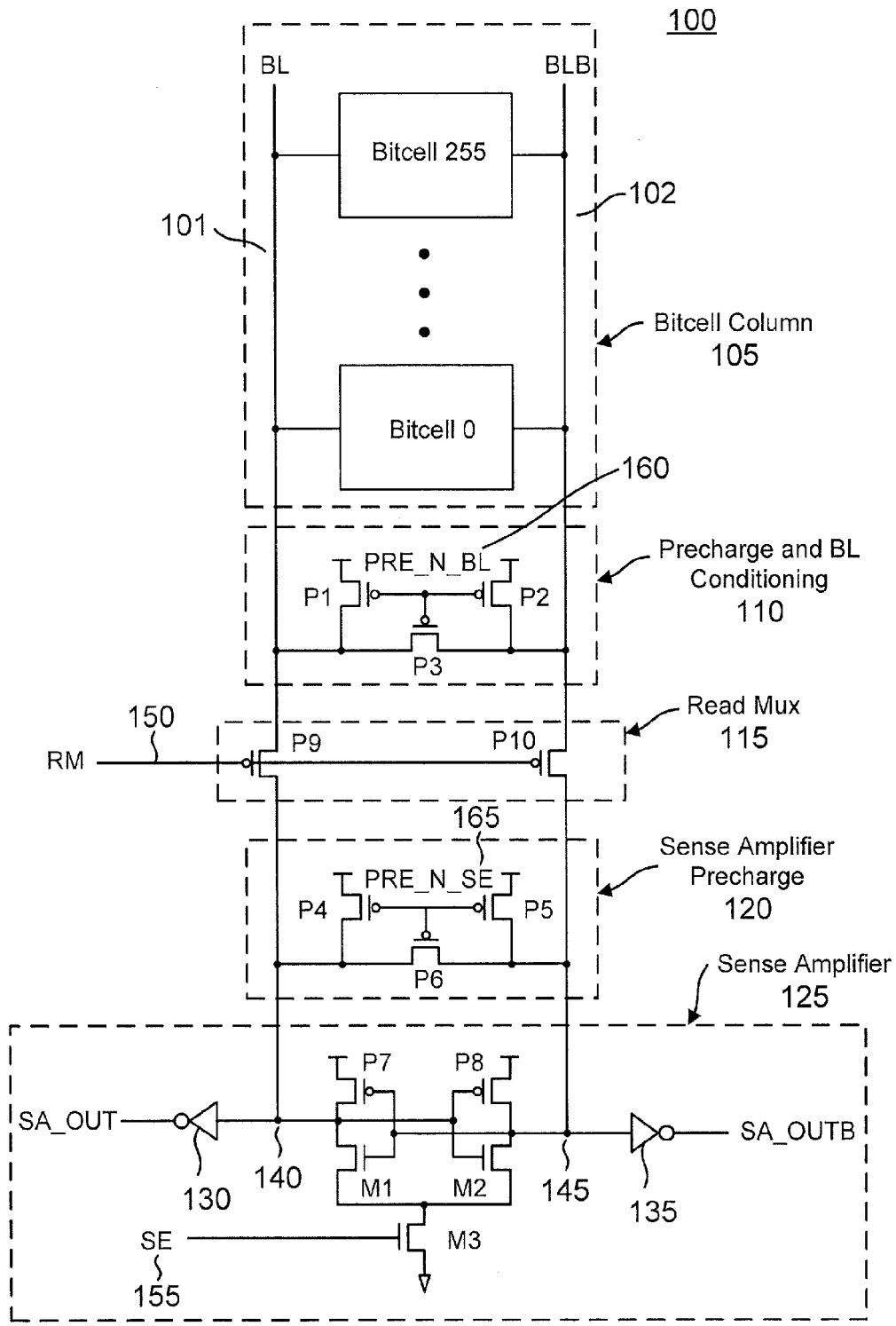
FIG. 1 is a circuit diagram of a PDP SRAM in accordance with an embodiment of the disclosure.

Turning now to the drawings, an example PDP SRAM 100 having independently controlled bit line precharging and sense amplifier input node precharging is shown in FIG. 1. A bit line (BL) 101 and a complement bit line (BLB) 102 form a pair of bit lines for a column of bit cells ranging from a bitcell 0 to a bitcell 255. There would thus be 256 word lines (not illustrated) corresponding to the bitcells so that a given bitcell may be coupled to the pair of bit lines through an assertion of the corresponding word line. It will be appreciated that the number of bit cells within a column and thus the number of corresponding word lines may be greater or less than shown in PDP SRAM 100 in alternative embodiments. To provide its PDP functionality, PDP SRAM 100 completes a read operation and also a write operation in one clock cycle such as in one cycle of a system clock discussed further herein. Prior to a read cycle, the bit lines are precharged to a memory power supply voltage VDD by a bit line precharge circuit 110. This precharge may also be denoted as a conditioning of the bit lines. Bit line precharge circuit 110 may include a PMOS transistor P1 having its source tied to a memory power supply node and its drain tied to true bit line 101. Similarly, bit line precharge circuit 110 may include a PMOS transistor P2 having its source tied to the memory power supply node and its drain tied to complement bit line 102. An active low bit line precharge signal (PRE_N_BL) 160 drives the gates of transistors P1 and P2 so as to turn on these transistors for a read precharge period prior to a read cycle. In addition, bit line precharge signal 160 is also pulled low to precharge the bit lines prior to a write cycle. To keep the voltage of both bit lines equal during the precharging, bit line precharge signal 160 drives a gate of a PMOS transistor P3 having one drain/source terminal tied to true bit line 101 and a remaining drain/source terminal tied to complement bit line 102.

During the read cycle, the appropriate word line is asserted for a read word line assertion period so that the corresponding bitcell may develop a voltage difference across the bit lines responsive to its stored binary content. This read word line assertion period may have a duration that is different from a subsequent duration in which the word line is asserted for a write operation. Alternatively, these durations may be the same. In the read operation while the word line voltage is asserted, one of the bit lines is maintained by the accessed bitcell at VDD whereas the remaining bit line is discharged towards ground. It would be too slow and consume too much power to extend the read word line assertion period during which the word line is asserted such that the remaining bit line is completely discharged to ground by the accessed bitcells. Instead, the read word line assertion period has a duration such that the remaining bit line is only partially discharged to ground upon completion of the read word line assertion period.

At the close of the read word line assertion period, a read multiplexer 115 isolates the bit lines from a pair of input nodes 140 and 145 to a sense amplifier 125. Read multiplexer 115 responds to an active-low read multiplexer control signal (RM) 150 that is de-asserted high to the memory power supply voltage VDD to isolate the bit lines from sense amplifier input nodes 140 and 145. Read multiplexer 115 includes a PMOS transistor P9 having a source coupled to true bit line 101 and a drain coupled to sense amplifier input node 140. Similarly, read multiplexer 115 includes a PMOS transistor P10 having a source coupled to complement bit line 102 and a drain coupled to sense amplifier input node 145. Read multiplexer control signal 150 drives the gates of transistors P9 and P10 such that when read multiplexer control signal 150 is de-asserted (as an active low signal) to the memory power supply voltage VDD, transistors P9 and P10 are fully off to isolate sense amplifier input nodes 140 and 145 from their respective bit lines. This isolation occurs during the precharging of the bit lines and the precharging of the sense amplifier input nodes. Conversely, this isolation is broken during the read word line assertion period by asserting read multiplexer control signal 150 to ground so that transistors P9 and P10 are fully on.

A sense amplifier precharge circuit 120 precharges sense amplifier input nodes 140 and 145 prior to the assertion of the word line voltage for a read operation. Sense amplifier precharge circuit 120 is analogous to bit line precharge circuit 110 in that sense amplifier precharge circuit 120 may also include three PMOS transistors. A PMOS transistor P4 in sense amplifier precharge circuit 120 has a source coupled to the memory power supply node and a drain coupled to sense amplifier input node 140. Similarly, a PMOS transistor P5 has its source tied to the memory power supply node and a drain coupled to sense amplifier input node 145. A PMOS transistor P6 in sense amplifier precharge circuit 120 has one drain/source terminal coupled to sense amplifier input node 140 and a remaining drain/source terminal coupled to sense amplifier input node 145 to ensure that these nodes are equally precharged. An active-low sense amplifier precharge signal (PRE_N_SE) 165 drives the gates of transistors P4, P5, and P6 so that these transistors are turned off when sense amplifier precharge control signal 165 is de-asserted to the memory power supply voltage VDD. Conversely, transistors P4, P5, and P6 are switched fully on when sense amplifier precharge signal 165 is asserted to ground.

Sense amplifier 125 comprises a voltage-mode sense amplifier that includes two-cross-coupled inverters driven by input nodes 140 and 145. A first inverter comprises a serial stack of a PMOS transistor P7 and an NMOS transistor M1 whose gates are tied to sense amplifier input node 145. The source of transistor P7 is coupled to the memory power supply node whereas its drain is tied to the drain of transistor M1. The source of transistor M1 couples to a drain for a current source transistor M3 that in turn has its source tied to ground. In addition, the drains for transistors P7 and M1 are tied to sense amplifier input node 140. A second inverter comprises a serial stack of a PMOS transistor P8 and an NMOS transistor M2 whose gates are tied to sense amplifier node 140 and whose drains are tied to sense amplifier input node 145. The source of transistor P8 couples to the memory power supply node and its drain couples to the drain of transistor M2. Similar to the coupling for transistor M1, the source of transistor M2 couples to the drain of current source NMOS transistor M3. A sense enable signal (SE) 155 drives the gate of current source transistor M3 so that it conducts a bias current when an active-high sense enable signal 155 is asserted to the power supply voltage VDD. With regard to the bit decision by sense amplifier 125, an inverter 130 inverts the voltage of input node 140 to form a sense amplifier output signal (SA_OUT). Similarly, an inverter 135 inverts the voltage of input node 145 to form a complement sense amplifier output signal (SA_OUTB).

Sense enable signal 155 is asserted to the memory power supply voltage VDD near the end of the read word line assertion period. At the assertion of sense enable signal 155, a differential voltage will have developed across the bit lines responsive to the binary content of the accessed bitcell. During the assertion of sense enable signal 155, read multiplexer control signal 150 will be de-asserted high to the memory power supply voltage VDD to isolate the sense amplifier input nodes from their respective bit lines. At this time, one of the sense amplifier input nodes will thus be discharged slightly from the memory power supply voltage VDD depending upon the binary content of the accessed bitcell. For example, suppose sense amplifier input node 140 is the discharged node. Transistor M2 will then tend to turn off in comparison to transistor M1. The feedback through the cross-coupled inverters in turn causes all the tail current generated by current source transistor M3 to steer entirely through transistor M1 such that sense amplifier node 140 discharges to ground while sense amplifier node 145 remains charged to the memory power supply voltage VDD. The sense amplifier output signal SA_OUT will then swing high to VDD whereas complement sense amplifier output signal SA_OUTB remains discharged at ground. The complement of these sense amplifier outputs occurs for a complementary binary state in the accessed bitcell such that the differential bit line voltage cause a slight discharge of sense amplifier input node 145 compared to node 140. Regardless of binary content for the accessed bitcell, the sense enable signal 155 is then released after the development of the sense amplifier output signals to finish a read operation.

With regard to the read operation in a conventional memory, the timing of the bit line precharging and sense amplifier precharging presented some challenge. In particular, it was conventional to use a common control signal for both the bit line and the sense amplifier precharging. To boost operating speed, the bit line precharging for a write operation should begin as soon as the word line assertion is released for the preceding read operation. But the assertion of sense enable signal 155 continues for some time after the word line is released. If sense amplifier precharge signal 165 is asserted low while one of transistors M1 or M2 is conducting during the sense enable signal assertion, a crossbar current is then discharged to ground through the conducting one of transistors M1 and M2 and also through current source transistor M3. In a common precharge control signal embodiment, a compromise must thus be reached with regard to speed versus power consumption. Precharging the bit lines while sense enable signal 155 is still asserted boosts operating speed but wastes power through the crowbar currents produced by the simultaneous precharging of the sense amplifier input nodes. Conversely, waiting until after sense enable signal 155 is released to precharge the bit lines and the sense amplifier input nodes saves power with regard to reducing the crowbar current discharge but slows the memory operating speed.

To increase the memory speed operation while eliminating or sharply reducing the discharge of crowbar current, sense amplifier precharge signal 165 is asserted responsive to a falling edge of sense enable signal 155. However, bit line precharge signal 160 is asserted responsive to falling edge of a memory clock. Bit line precharge signal 160 may thus be asserted while sense enable signal 155 is still asserted to boost the memory operating speed. Since sense amplifier precharge signal 165 is not asserted until sense enable signal 155 is released to ground, the discharge of crossbar current in sense amplifier 125 is eliminated or sharply reduced with regard to conventional architectures.

Figure 2:
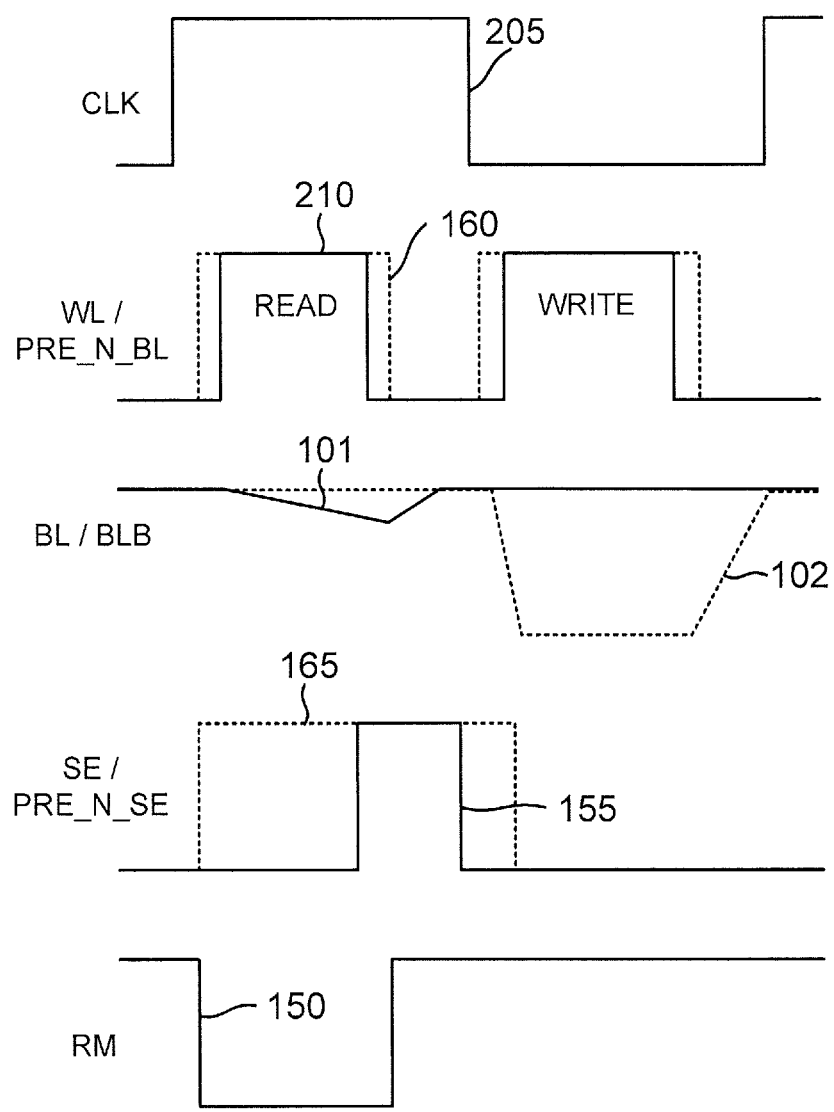
FIG. 2 is a timing diagram for various signals in the PDP SRAM of FIG. 1.

The resulting timing may be better appreciated with reference to the timing diagram of FIG. 2. A system clock 205 triggers all the memory read and write operations. A memory clock such as a bank clock (shown in FIG. 3 discussed below) has a rising edge triggered by the rising edge of system clock 205. A bank clock is asserted to the particular bank that is active for a given read and write cycle. Since SRAM 100 (FIG. 1) is a PDP memory, there is a read and a write cycle in one period of system clock 205. Given that the memory clock has a rising edge that is triggered by the rising edge of system clock 205, the memory clock will be low prior to the rising edge of system clock 205. This rising edge of the memory clock triggers a read operation during which a word line voltage 210 is asserted for the read word line assertion period. Precharging of bit lines 101 and 102 while word line voltage 210 is asserted could disturb the memory cell contents. To prevent a bit line precharging while the memory cell is accessed by the asserted word line voltage 210 in the read operation, the rising edge for word line voltage 210 is delayed with respect to the rising edge for bit line precharge signal 160. Both word line voltage 210 and bit line precharge signal 160 have a rising edge that is triggered by the rising edge of the memory clock, which in turn is triggered by the rising edge of system clock 205. Conversely, the falling edge of bit line precharge signal 160 follows the falling edge of word line voltage 210. The falling edge of bit line precharge signal 160 is triggered by the falling edge of the memory clock. In that regard, the memory clock falling edge occurs at a self-timed delay with regard to the rising edge of system clock 205. The falling edge of the memory clock is thus not triggered by the falling edge of the system clock 205 but instead occurs at the self-timed delay after the rising edge of system clock 205. Since bit line precharge signal 160 is an active-low signal, it is asserted by being discharged to ground. In contrast, word line voltage 210 is an active-high signal so it is asserted by being charged to the memory power supply voltage VDD.

Responsive to the rising edge of the memory clock, active-low read multiplexer control signal 150 is asserted (grounded) to couple the sense amplifier input nodes to their respective bit lines. Read multiplexer control signal 150 is de-asserted to the memory power supply voltage VDD responsive to the falling edge of the memory clock. Read multiplexer 115 thus isolates the sense amplifier input nodes from their respective bit lines when bit line precharge signal 160 is asserted low to begin the precharging of the bit lines for the subsequent write operation. During the read word line assertion period, a differential voltage difference develops between bit line 101 and complement bit line voltage 102. This differential voltage depends upon the binary contents of the memory cell being accessed in the read operation. Nearing the end of the read word line assertion period, sense enable (SE) signal 155 is asserted to trigger the sensing of the memory cell contents. The falling edge of sense amplifier precharge signal 165 is responsive to the falling edge of sense enable signal 155 such that sense amplifier precharge signal 165 is not asserted until after sense enable signal 155 has discharged to ground.

Figure 3:
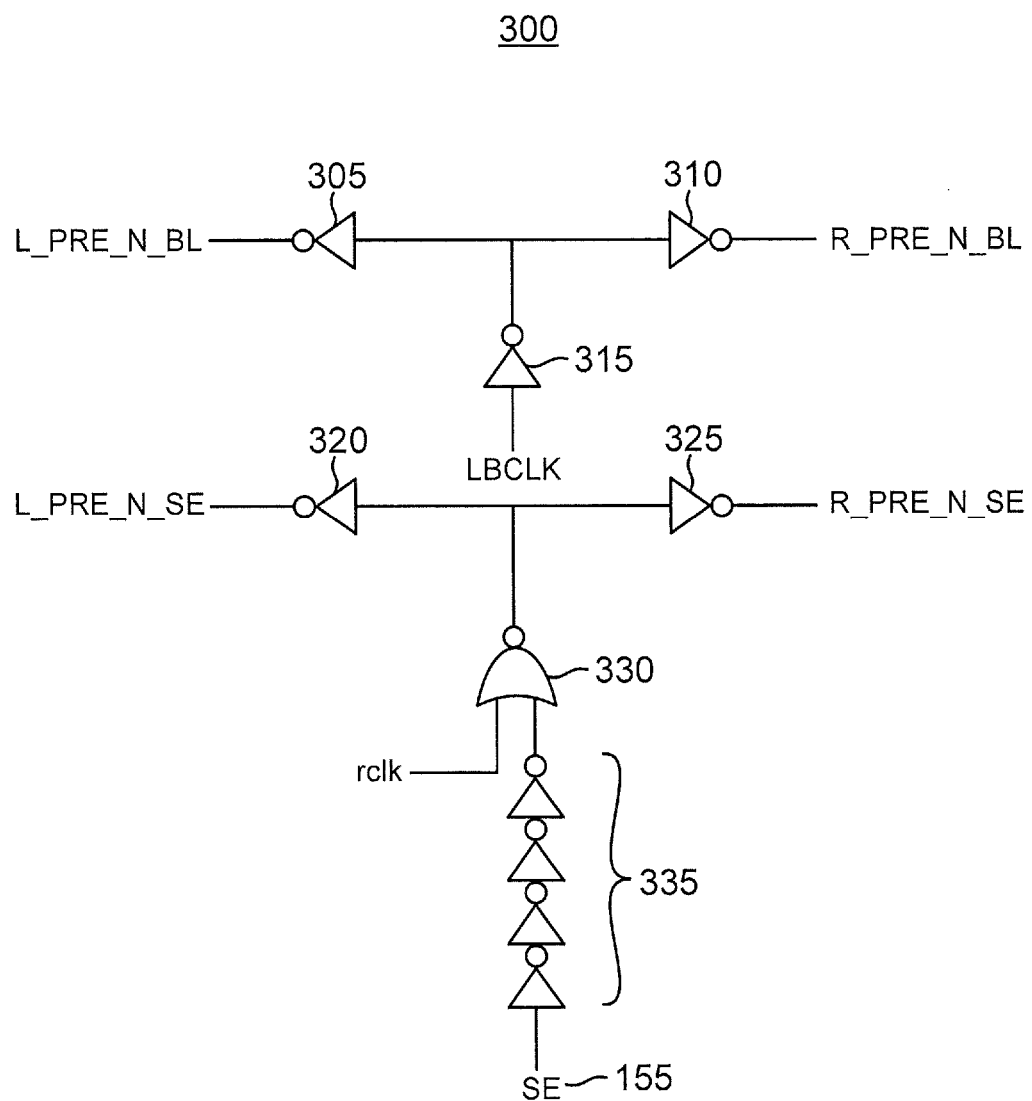
FIG. 3 is a circuit diagram of a control signal generator for generating the bit line and sense amplifier precharge signals for the PDP SRAM of FIG. 1.

A control signal generator 300 illustrated in FIG. 3 controls the assertion and de-assertion of bit line precharge signal 160 and sense amplifier precharge signal 165. These signals are both de-asserted to the memory power supply voltage VDD responsive to the rising edge of the memory clock that triggers a read operation. But they are independently asserted with respect to the subsequent write operation as discussed above. In the embodiment of FIG. 3, control signal generator 300 controls a left and a right memory bank. The bit line precharge control signal thus consists of a right bank bit line precharge control signal (R_PRE_N_BL) and a left bank bit line precharge control signal (L_PRE_N_BL). It will be appreciated however, that any number of such bit line precharge control signals may be generated depending upon whether there are banks or just a single array of memory cells. Similarly, control signal generator 300 generates a left bank sense amplifier precharge signal (L_PRE_N_SE) as well as a right bank sense amplifier precharge signal (R_PRE_N_SE).

To produce the bit line precharge control signals, control signal generator 300 delays a memory clock such as a bank clock (LBCLK). Since there are two banks in this embodiment, the bank clock is delayed through an inverter 315 and an inverter 305 to produce the left bank bit line precharge signal. Similarly, the bank clock is delayed through inverter 315 and an inverter 310 to produce the right bank bit line precharge signal. As discussed earlier, the bank clock is a memory clock that during the read operation has a rising edge triggered by the rising edge of the system clock followed by self-timed delay with regard to its falling edge. This falling edge triggers the release of the word line voltage 210. The bank clock has another rising edge that is triggered by the falling edge of the system clock with regard to initiating a write operation. The bit line precharging for the write operation thus occurs in the period between the falling edge of the bank clock after the read operation and ends with the assertion of the bank clock for the write operation. To account for system mismatches and RC delay, the falling edge of the bank clock is delayed by a two-inverter-delay as performed in control signal generator 300 with regard to inverters 315 and 305 or inverters 315 and 310. When the bank clock goes high to trigger the write operation, bit line precharge signal 160 will again be de-asserted to the memory power supply voltage VDD. Analogous to the read operation, word line voltage 210 is asserted for a write operation period during the write operation. This assertion of word line voltage 210 is delayed with respect to the assertion of the bank clock so that the bitcell is not accessed while the bit lines are being precharged for the write operation. The bank clock falls after the falling edge of the word line voltage 210 for the write operation analogously to its delayed falling edge with regard to the read operation falling edge of word line voltage 210. While bit line voltage 210 is asserted during a write operation, one of the bit lines such as bit line 102 is discharged to ground. This selective discharge in general depends upon the binary value being written into the accessed bitcell. In one embodiment, the pair of inverters 315 and 305 or the pair of inverters 315 and 310 may be deemed to comprise a means for asserting the bit line precharge signal responsive to a delayed version of a falling edge of a memory clock and for de-asserting the bit line precharge signal responsive to a delayed version of a rising edge of the memory clock.

In contrast to the bit line precharging, sense amplifier precharging need not be interrupted during a word line assertion for the write operation. To produce the sense amplifier precharge signals, control signal generator 300 is thus responsive to a read clock (rclk) that is processed through a logic gate such as a NOR gate 330. In contrast to a memory clock such as the bank clock, the read clock is asserted only in response to the rising edge of system clock 205. The rising edge of the read clock is thus substantially simultaneous with the rising edge of the bank clock for the read operation. However, the read clock has a self-timed falling edge that occurs slightly before the read operation falling edge for the bank clock. NOR gate 330 also receives a delayed version of sense enable signal 155 as delayed through, for example, a serial chain of four inverters 335. NOR gate 330 will thus drive its output high only when both the delayed version of sense enable signal 155 and the read clock are both low (discharged to ground). The sense amplifier precharge signals L_PRE_N_SE and R_PRE_N_SE will thus be charged to the memory power supply voltage VDD responsive to the rising edge of the read clock. The read clock has a falling edge prior to the falling edge of sense enable signal 155. The sense amplifier precharge signals will then be asserted low responsive to the falling edge of sense enable signal 155 and will stay low until the read clock is again asserted in a subsequent read operation. A method of operation for a PDP memory in accordance with an embodiment of the disclosure will now be discussed. In one embodiment, inverters 335, NOR gate 330 and either inverter 320 or 325 may be deemed to comprise a means for asserting the sense amplifier precharge signal responsive to a delayed version of a falling edge for the sense enable signal.

Figure 4:
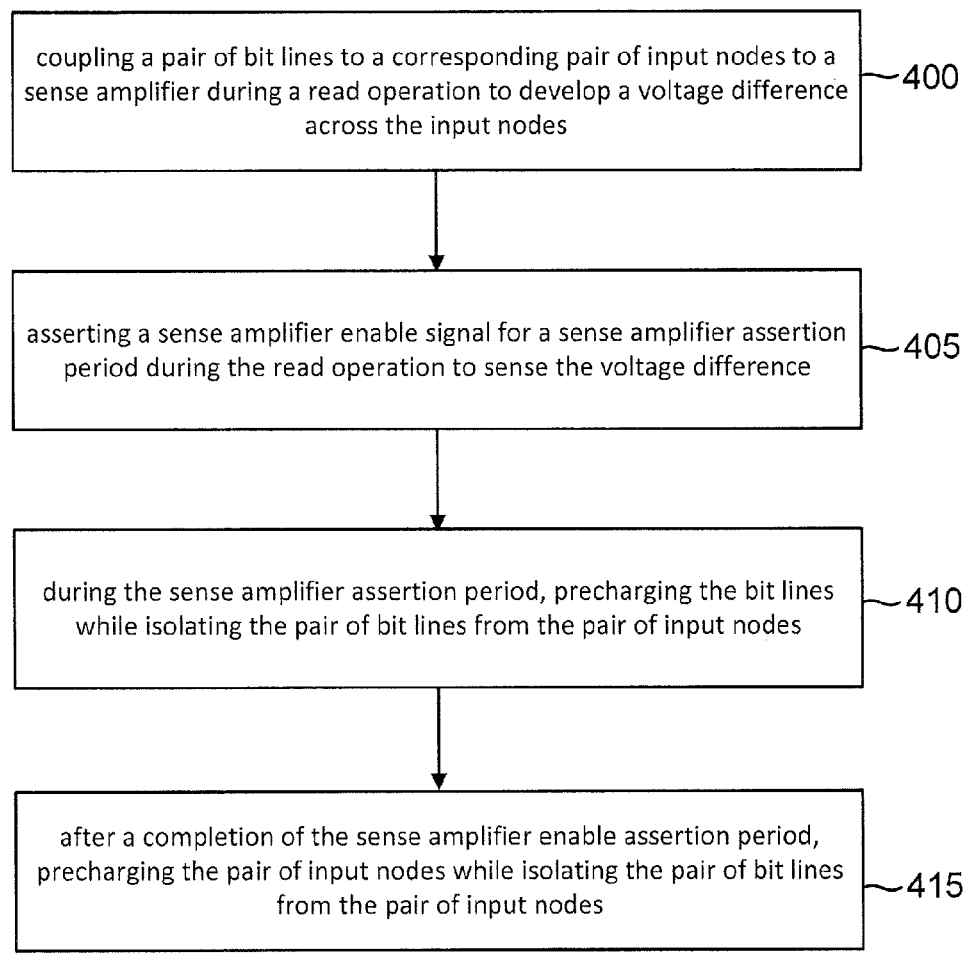
FIG. 4 is a flow chart for a method of operation for a PDP SRAM in accordance with an embodiment of the disclosure.

An example method of operation for a PDP memory will now be discussed with regard to the flowchart of FIG. 4. An initial act 400 comprises coupling a pair of bit lines to a corresponding pair of input nodes to a sense amplifier during a read operation to develop a voltage difference across the input nodes. The coupling of bit lines 101 and 102 during the read operation of FIG. 3 is an example for the development of the voltage difference of act 400. The method further comprises an act 405 of asserting a sense amplifier enable signal for a sense amplifier assertion period during the read operation to sense the voltage difference. The assertion of sense enable signal 155 during the read operation of FIG. 3 is an example of act 405. The method also comprises an act 410 that occurs during the sense amplifier assertion period and comprises precharging the bit lines while isolating the pair of bit lines from the pair of input nodes. The assertion of bit line precharge signal 160 during the read operation of FIG. 3 is an example of act 410. Finally, the method includes an act 415 that occurs after a completion of the sense amplifier enable assertion period and comprises precharging the pair of input nodes while isolating the pair of bit lines from the pair of input nodes. The assertion of sense amplifier precharge signal during the read operation of FIG. 3 to charge the sense amplifier nodes 140 and 145 in PDP memory 100 is an example of act 415.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A pseudo-dual-port (PDP) memory, comprising:
   a pair of bit lines;
   a bit line precharge circuit configured to precharge the pair of bit lines responsive to an assertion of a bit line precharge signal;
   a read multiplexer configured to selectively couple the pair of bit lines to a pair of input nodes of a sense amplifier responsive to an assertion of a read multiplexer signal;
   a sense amplifier precharge circuit for precharging the pair of input nodes of the sense amplifier responsive to an assertion of a sense amplifier precharge signal; and
   a control signal generator configured to assert the bit line precharge signal responsive to a self-timed falling edge of a first memory clock that occurs while a sense enable signal is asserted during a read operation in a first portion of a system clock cycle and to assert the sense amplifier precharge signal responsive to a falling edge of the sense enable signal to precharge the pair of input nodes for the sense amplifier prior to a write operation in a second portion of the system clock cycle.

2. The PDP memory of claim 1, wherein the control signal generator is further configured to de-assert the bit line precharge signal responsive to a rising edge of the first memory clock.

3. The PDP memory of claim 2, wherein the first memory clock comprises a bank memory clock having a rising edge responsive to a rising edge of a system clock and the self-timed falling edge.

4. The PDP memory of claim 2, wherein the control signal generator comprises a serial chain of inverters configured to delay the first memory clock to produce the bit line precharge signal.

5. The PDP memory of claim 4, wherein the serial chain of inverters comprises a serial pair of inverters.

6. The PDP memory of claim 1, wherein the control signal generator is further configured to de-assert the sense amplifier precharge signal responsive to a rising edge of a second memory clock.

7. The PDP memory of claim 6, wherein the second memory clock comprises a read clock.

8. The PDP memory of claim 7, wherein the control signal generator comprises:
   a serial chain of inverters configured to delay the sense enable signal to produce a delayed sense enable signal, and
   a logic gate configured to process the delayed sense enable signal and the read clock to produce the sense amplifier precharge signal.

9. The PDP memory of claim 8, wherein the logic gate comprises a NOR gate, and wherein the control signal generator further comprises an inverter to invert an output signal from the NOR gate to produce the sense amplifier precharge signal.

10. The PDP memory of claim 1, wherein the bit line precharge circuit comprises a first PMOS transistor having its source tied to a power supply node and its drain tied to a true one of the bit lines, and wherein the bit line precharge circuit further comprises a second PMOS transistor having its source tied to the power supply node and its drain tied to a remaining complement one of the bit lines, wherein the first PMOS transistor and the second PMOS transistor are each configured to have their gates driven by the bit line precharge signal.

11. The PDP memory of claim 1, wherein the sense amplifier precharge circuit comprises a first PMOS transistor having its source tied to a power supply node and its drain tied to a first one of the input nodes, and wherein the bit line precharge circuit further comprises a second PMOS transistor having its source tied to the power supply node and its drain tied to a remaining second one of the input nodes, wherein the first PMOS transistor and the second PMOS transistor are each configured to have their gates driven by the sense amplifier precharge signal.

12. The PDP memory of claim 1, wherein the sense amplifier comprises a pair of cross-coupled inverters.

13. The PDP memory of claim 12, wherein the sense amplifier further comprises a current source transistor coupled between ground and a ground node for the pair of cross-coupled inverters, and wherein the current source transistor is configured to have its gate driven by the sense enable signal.

14. The PDP memory of claim 13, wherein the current source transistor comprises an NMOS transistor.

15. A method, comprising:
coupling a pair of bit lines to a corresponding pair of input nodes for a sense amplifier during a read operation in a first portion of a system clock cycle for a pseudo-dual-port memory to develop a voltage difference across the input nodes;
asserting a sense enable signal for a sense amplifier assertion period during the read operation to cause the sense amplifier to sense the voltage difference;
during the sense amplifier assertion period in the read operation, precharging the bit lines while isolating the pair of bit lines from the pair of input nodes;
after a completion of the sense amplifier enable assertion period, precharging the pair of input nodes while isolating the pair of bit lines from the pair of input nodes for a write operation in a second portion of the system clock cycle for the pseudo-dual-port memory.

16. The method of claim 15, wherein precharging the bit lines comprises precharging the bit lines responsive to a falling edge of a memory clock.

17. The method of claim 16, wherein the memory clock comprises a bank clock.

18. The method of claim 15, wherein precharging the pair of input nodes is responsive to a falling edge of the sense enable signal.

19. A pseudo-dual-port (PDP) memory, comprising:
a pair of bit lines;
a bit line precharge circuit configured to precharge the pair of bit lines responsive to an assertion of a bit line precharge signal;
a read multiplexer configured to selectively couple the pair of bit lines to a corresponding pair of input nodes of a sense amplifier responsive to an assertion of a read multiplexer signal;
a sense amplifier precharge circuit for precharging the pair of input nodes of the sense amplifier responsive to an assertion of a sense amplifier precharge signal;
first means for asserting the bit line precharge signal responsive to a delayed version of a falling edge of a memory clock for a read operation during a first portion of a system clock cycle and for de-asserting the bit line precharge signal responsive to a delayed version of a rising edge of the memory clock; and
second means for asserting the sense amplifier precharge signal responsive to a delayed version of a falling edge for a sense enable signal to precharge the pair of input nodes for the sense amplifier prior to a write operation in a second portion of the system clock cycle.

20. The PDP memory of claim 19, further comprising a plurality of SRAM bit cells; and a corresponding plurality of word lines.

* * * * *